US012123087B2

(12) United States Patent
Inagaki

(10) Patent No.: US 12,123,087 B2
(45) Date of Patent: Oct. 22, 2024

(54) MASK STRUCTURE FOR DEPOSITION DEVICE, DEPOSITION DEVICE, AND OPERATION METHOD THEREOF

(71) Applicant: United Semiconductor Japan Co., Ltd., Kuwana (JP)

(72) Inventor: Satoshi Inagaki, Kuwana (JP)

(73) Assignee: United Semiconductor Japan Co., Ltd., Kuwana (JP)

( * ) Notice: Subject to any disclaimer, the term of this patent is extended or adjusted under 35 U.S.C. 154(b) by 75 days.

(21) Appl. No.: 17/573,647

(22) Filed: Jan. 12, 2022

(65) Prior Publication Data
US 2022/0136094 A1    May 5, 2022

Related U.S. Application Data

(62) Division of application No. 17/024,677, filed on Sep. 17, 2020, now Pat. No. 11,255,011.

(51) Int. Cl.
*C23C 14/04*    (2006.01)
*C23C 16/04*    (2006.01)
*G03F 7/00*    (2006.01)

(52) U.S. Cl.
CPC .......... *C23C 14/044* (2013.01); *C23C 16/042* (2013.01); *G03F 7/70216* (2013.01)

(58) Field of Classification Search
CPC ..... C23C 14/044; C23C 14/042; C23C 14/50; C23C 16/042; C23C 16/4581
See application file for complete search history.

(56) References Cited

U.S. PATENT DOCUMENTS 5,437,757 A    8/1995  Rice
5,690,795 A    11/1997 Rosenstein
(Continued)

FOREIGN PATENT DOCUMENTS

JP    8-78509    3/1996
JP    8-186074   7/1996
(Continued)

OTHER PUBLICATIONS

Office action mailed/issued on May 30, 2022 for TW application No. 110130880, filing date: Aug. 20, 2021, pp. 1-4.
(Continued)

*Primary Examiner* — Dah-Wei D. Yuan
*Assistant Examiner* — Nga Leung V Law
(74) *Attorney, Agent, or Firm* — Winston Hsu

(57) ABSTRACT

A mask structure for a deposition device includes first segments and second segments. The first segments are arranged in a direction surrounding a central axis and separated from one another. The second segments are disposed above the first segments. Each of the second segments overlaps two of the first segments adjacent to each other in a vertical direction parallel to an extending direction of the central axis. A deposition device includes a process chamber, a stage, and the mask structure. The stage is at least partially disposed in the process chamber and includes a holding structure of a substrate. The mask structure is disposed in the process chamber, located over the stage, and covers a peripheral region of the substrate to be held on the stage. An operation method of the deposition device includes horizontally adjusting positions of the first segments and the second segments respectively between different deposition processes.

12 Claims, 18 Drawing Sheets

(56) References Cited

U.S. PATENT DOCUMENTS

| | | |
|---|---|---|
| 5,868,847 A | 2/1999 | Chen |
| 6,045,671 A | 4/2000 | Wu |
| 6,132,805 A | 10/2000 | Moslehi |
| 2007/0111339 A1 | 5/2007 | Wege |
| 2007/0258076 A1* | 11/2007 | Maria Derksen ....... G03F 7/707 355/53 |
| 2009/0110847 A1 | 4/2009 | Amelung |
| 2013/0299345 A1 | 11/2013 | Abarra |
| 2016/0038105 A1 | 2/2016 | Hayman |
| 2017/0062246 A1 | 3/2017 | Wu |
| 2017/0110295 A1 | 4/2017 | Hwang |
| 2021/0202288 A1 | 7/2021 | Sun |

FOREIGN PATENT DOCUMENTS

| | | |
|---|---|---|
| JP | 8-264449 | 10/1996 |
| JP | 9-246187 | 9/1997 |
| JP | 11-150085 | 6/1999 |
| JP | 2000-77506 | 3/2000 |
| JP | 2005-120410 | 5/2005 |
| JP | 2007-318121 | 12/2007 |
| JP | 2013-162075 | 8/2013 |
| JP | 2013-246352 | 12/2013 |
| JP | 2013-253316 | 12/2013 |
| JP | 2018-154851 | 10/2018 |
| KR | 20-2017-0000465 U | 2/2017 |
| KR | 10-2018-0014014 A | 2/2018 |
| WO | 2013/026492 A1 | 2/2013 |

OTHER PUBLICATIONS

Office Action mailed on Aug. 8, 2023 for the Korean Application No. 10-2021-0114632, filing date Aug. 30, 2021, pp. 1-4., Aug. 8, 2023.
Notice of Allowance mailed/issued on Oct. 31, 2022 for TW application No. 110130880, filing date: Aug. 20, 2021, pp. 1-4.
Office action mailed on Mar. 30, 2024 for the China application No. 202110804665.8, filing date Jul. 16, 2021, p. 1-8. ,Mar. 30, 2024.
Requirement for Restriction/Election; U.S. Appl. No. 17/024,677; Jun. 1, 2021.
Non-Final Office Action; U.S. Appl. No. 17/024,677; Jul. 9, 2021.
Final Office Action; U.S. Appl. No. 17/024,677; Oct. 15, 2021.
Notice of Allowance; U.S. Appl. No. 17/024,677; Nov. 12, 2021.
Notice of allowance mailed on Feb. 23, 2024 for the Korean Application No. 10-2021-0114632, filing date Aug. 30, 2021, pp. 1-4, Feb. 23, 2024.
Notice of allowance mailed on Aug. 24, 2024 for the China application No. 202110804665.8, filing date Jul. 16, 2021, p. 1-2. ,Aug. 24, 2024.

* cited by examiner

MASK STRUCTURE FOR DEPOSITION DEVICE, DEPOSITION DEVICE, AND OPERATION METHOD THEREOF

CROSS REFERENCE TO RELATED APPLICATIONS

This application is a division of application Ser. No. 17/024,677 filed on Sep. 17, 2020, now allowed, which is incorporated by reference herein in its entirety.

BACKGROUND OF THE INVENTION

1. Field of the Invention

The present invention relates to a mask structure for a deposition device, a deposition device, and an operation method of the deposition device, and more particularly, to a mask structure including segments overlapping each other, a deposition device including the mask structure, and an operation method of the deposition device.

2. Description of the Prior Art

Semiconductor integrated circuits undergo a variety of processing steps during manufacture, such as film deposition, photolithography, etching, and so forth. Chemical vapor deposition (CVD) and physical vapor deposition (PVD) are the general film deposition approaches applied in the semiconductor manufacturing processes. During the film deposition process, such as a sputtering deposition process, a film suppression area is defined on an outer peripheral area of a wafer for prohibiting forming a material film thereon and avoiding related issues, such as film peeling at the edge of the wafer. In addition, the film suppression area preferably may be shrunk for increasing the number of effective chips per wafer and reducing the cost per chip. Therefore, it is important to control the film suppression area precisely in the film deposition process. Generally, a clamp ring configured to cover the outer peripheral area of the wafer is applied in the sputtering deposition process. It is difficult to control the film suppression area corresponding to the clamp ring precisely because the material film will accumulate at the inner edge of the clamp ring after a plurality of the film deposition processes and influence the film suppression area on the wafer.

SUMMARY OF THE INVENTION

A mask structure for a deposition device, a deposition device, and an operation method of the deposition device are provided in the present invention. The mask structure includes first segments separated from one another and second segments overlapping the first segments adjacent to each other for controlling a film suppression area on a substrate in a deposition process more precisely and more conveniently.

According to an embodiment of the present invention, a mask structure for a deposition device is provided. The mask structure includes first segments and second segments. The first segments are arranged in a direction surrounding a central axis and separated from one another. The second segments are disposed above the first segments. Each of the second segments overlaps two of the first segments adjacent to each other in a vertical direction parallel to an extending direction of the central axis.

According to an embodiment of the present invention, a deposition device is provided. The deposition device includes a process chamber, a stage, and a mask structure. The stage is at least partially disposed in the process chamber and includes a holding structure of a substrate. The mask structure is disposed in the process chamber, located over the stage, and covers a peripheral region of the substrate to be held on the stage. The mask structure includes first segments and second segments. The first segments are arranged in a direction surrounding a central axis and separated from one another. The second segments are disposed above the first segments. Each of the second segments overlaps two of the first segments adjacent to each other in a vertical direction parallel to an extending direction of the central axis.

According to an embodiment of the present invention, an operation method of a deposition device is provided. The operation method includes the following steps. A deposition device is provided. The deposition device includes a process chamber, a stage, and a mask structure. The stage is at least partially disposed in the process chamber and includes a holding structure of a substrate. The mask structure is disposed in the process chamber, located over the stage, and covers a peripheral region of the substrate to be held on the stage. The mask structure includes first segments and second segments. The first segments are arranged in a direction surrounding a central axis and separated from one another. The second segments are disposed above the first segments. Each of the second segments overlaps two of the first segments adjacent to each other in a vertical direction parallel to an extending direction of the central axis. Positions of the first segments and the second segments are horizontally adjusted respectively between different deposition processes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-7 are schematic drawings illustrating an operation method of the deposition device according to the first embodiment of the present invention, wherein FIG. 4 is a schematic drawing illustrating positions of the mask structure and a first substrate in a first deposition process, FIG. 5 is a schematic drawing illustrating the first substrate after the first deposition process, FIG. 6 is a schematic drawing illustrating positions of the mask structure and a second substrate in a second deposition process, and FIG. 7 is a schematic drawing illustrating the second substrate after the second deposition process.

DETAILED DESCRIPTION

Although specific configurations and arrangements are discussed, it could be understood that this is done for illustrative purposes only. A person skilled in the pertinent art will recognize that other configurations and arrangements can be used without departing from the spirit and scope of the present disclosure. It will be apparent to a person skilled in the related art that the present invention can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

It could be understood that, although the terms first, second, etc. may be used herein to describe various elements, components, regions, layers and/or sections, these elements, components, regions, layers and/or sections are not be limited by these terms. These terms are only used to distinguish one element, component, region, layer and/or section from another. Thus, a first element, component, region, layer or section discussed below could be termed a second element, component, region, layer or section without departing from the teachings of the disclosure.

It could be understood that the meaning of "on," "above," and "over" in the present disclosure may be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Figure 1:
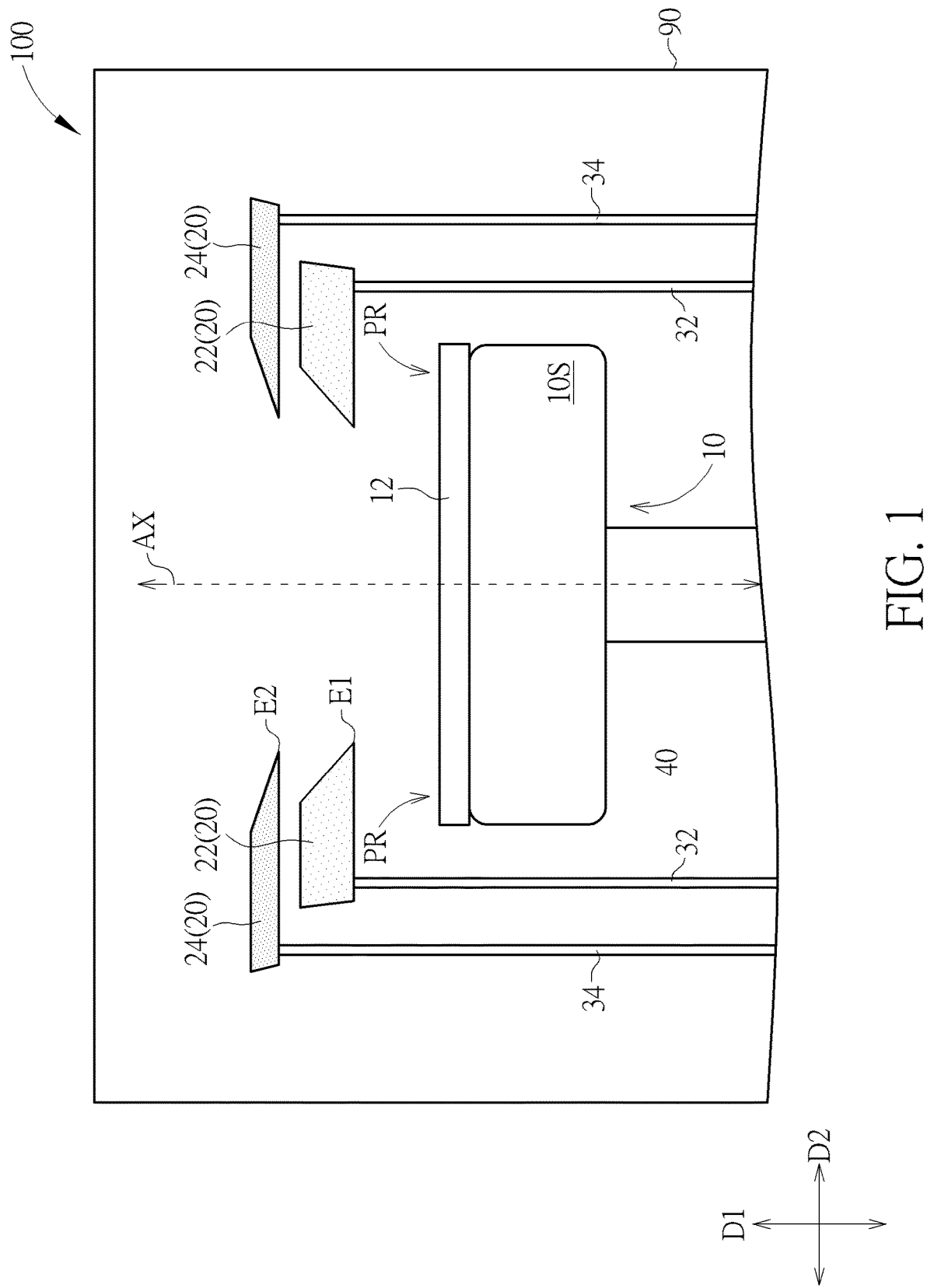
FIG. 1 is a schematic drawing illustrating a deposition device according to a first embodiment of the present invention.
Figure 2:
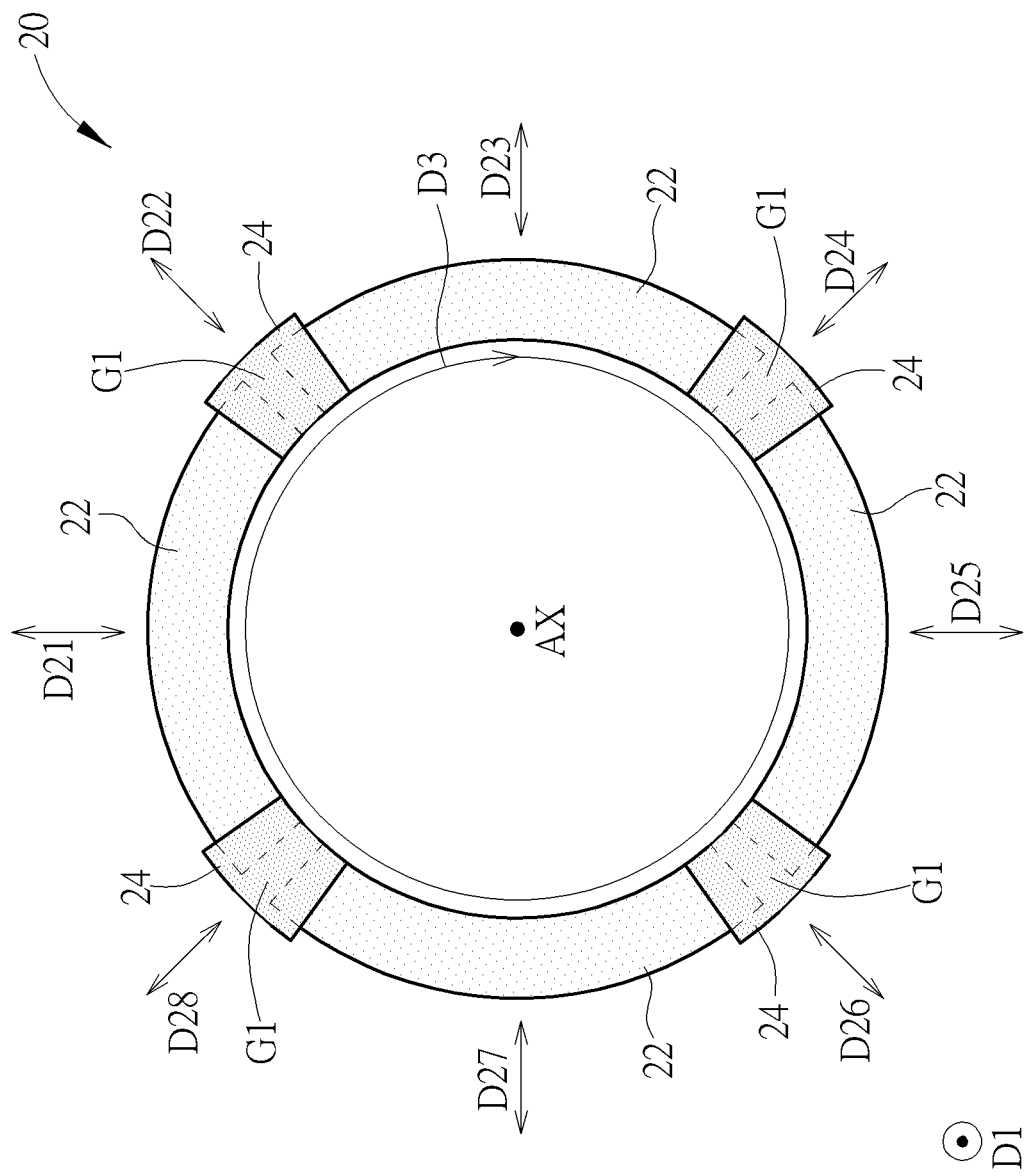
FIG. 2 is a schematic drawing illustrating a top view of a mask structure for a deposition device according to the first embodiment of the present invention.

FIG. 1 is a schematic drawing illustrating a deposition device according to a first embodiment of the present invention, and FIG. 2 is a schematic drawing illustrating a top view of a mask structure for a deposition device in this embodiment. As illustrated in FIG. 1 and FIG. 2, a mask structure 20 for a deposition device is provided. The mask structure 20 includes a plurality of first segments 22 and a plurality of second segments 24. The first segments 22 are arranged in a direction surrounding a central axis AX (such as a direction D3 represented in FIG. 2) and separated from one another. The second segments 24 are disposed above the first segments 22. Each of the second segments 24 overlaps two of the first segments 22 adjacent to each other in a vertical direction D1 parallel to an extending direction of the central axis AX. The mask structure 20 may be used in a deposition device, such as a deposition device 100 represented in FIG. 1, but not limited thereto. In other words, the mask structure 20 for the deposition device in the present invention may also be applied in other deposition device different from the deposition device 100 in structural design, deposition method, and/or other aspects.

In some embodiments, the second segments 24 may be arranged in the direction D3 surrounding the central axis AX also, and the direction D3 surrounding the central axis AX may be a circular direction, but not limited thereto. The second segments 24 may be separated from one another, and each of the second segments 24 may be separated from the first segments 22. In some embodiments, each of the first segments 22 and each of the second segments 24 may be arcuate in shape in a top view of the mask structure 20 (such as FIG. 2), but not limited thereto. In addition, each of the second segments 24 may further overlap a gap G1 between two of the first segments 22 adjacent to each other in the vertical direction D1, and a projection area of each of the second segments 24 in the vertical direction D1 (such as an area of one of the second segments 24 represented in FIG. 2) may be smaller than a projection area of each of the first segments 22 in the vertical direction D1 (such as an area of one of the first segments 22 represented in FIG. 2), but not limited thereto. In some embodiments, the first segments 22 may be regarded as main segments with relatively larger areas in the mask structure 20 and the second segments 24 may be regarded as sub segments with relatively smaller areas in the mask structure 20, but not limited thereto. In some embodiments, the projection area of each of the second segments 24 in the vertical direction D1 may be equal to or smaller than the projection area of each of the first segments 22 in the vertical direction D1. In some embodiments, an outer peripheral size of each of the second segments 24 may be larger than an outer peripheral size of each of the first segments in a horizontal direction (a radial direction in a horizontal plane orthogonal to the vertical direction D1).

In some embodiments, the material of each of the first segments 22 and the material of each of the second segments 24 may include quartz, metal, or other suitable materials with high heat resistance, low coefficient of thermal expansion, and/or high stability for avoiding reactions between a deposited material and the mask structure 20. In some embodiments, the material composition of each of the second segments 24 may be identical to or different from the material composition of each of the first segments 22 according to design considerations. In some embodiments, the number of the second segments 24 in the mask structure 20 may be equal to the number of the first segments 22 in the mask structure 20. For example, the number of the first segments 22 and the number of the second segments 24 in the mask structure 20 may equal to 4 respectively, but not limited thereto. In some embodiments, the number of the first segments 22 and the number of the second segments 24 in the mask structure 20 may be increased for controlling a film suppression area on a substrate in a deposition process more precisely.

As illustrated in FIG. 1 and FIG. 2, in some embodiments, the deposition device 100 may include a process chamber 90, a stage 10, and the mask structure 20 described above. The stage 10 is at least partially disposed in the process chamber 90 and includes a holding structure 10S of a substrate 12. The mask structure 20 is disposed in the process chamber 90, located over the stage 10, and covers a peripheral region PR of a substrate 12 to be held on the stage 10. The deposition device 100 may be used to perform a deposition process to the substrate 12 placed into the process chamber 90 and placed on the stage 10 for forming a deposited film on the substrate 12. In some embodiments, the deposition device 100 may include a sputtering deposition device, or a deposition device capable of performing other types of physical vapor deposition.

In some embodiments, at least a part of the central axis AX may be disposed above the stage 10 and extending in a direction orthogonal to a top surface of the stage 10. In some embodiments, the central axis AX may penetrate at least a part of the stage 10, but not limited thereto. In some embodiments, a central point of the substrate 12 disposed on the stage 10 may overlap the central axis AX in the vertical direction D1, but not limited thereto. The central point of the substrate 12 may be the geometrical center, the center of mass, and/or the center of gravity of the substrate 12. The substrate 12 may include a semiconductor substrate or a non-semiconductor substrate. The semiconductor substrate mentioned above may include a silicon substrate, an epitaxial silicon substrate, a silicon germanium substrate, a silicon carbide substrate, or a silicon-on-insulator (SOI) substrate, but not limited thereto. The non-semiconductor substrate mentioned above may include a glass substrate, a plastic substrate, a ceramic substrate, a stainless steel substrate, or a substrate made of other suitable materials.

In some embodiments, the deposition device 100 may further include a plurality of first supporting structures 32 and a plurality of second supporting structures 34. Each of the first supporting structures 32 may be connected with at least one of the first segments 22, and each of the second supporting structures 34 may be connected with at least one of the second segments 24. In some embodiments, each of the first supporting structures 32 may be located under the corresponding first segment 22, and each of the second supporting structures 34 may be located under the corresponding second segment 24 and at least partially located in the gap G1 between two of the first segments 22 adjacent to each other in the direction D3, but not limited thereto. In some embodiments, the first supporting structures 32 and the second supporting structures 34 may be used to support the first segments 22 and the second segments 24 of the mask structure 20 and respectively move the first segments 22 and the second segments 24 vertically (such as in the vertical direction) and/or horizontally (such as in a horizontal direction D2 represented in FIG. 1).

For example, as illustrated in FIG. 1 and FIG. 2, one of the first segments 22 may be movable in a horizontal direction D21, one of the second segments 24 may be movable in a horizontal direction D22, one of the first segments 22 may be movable in a horizontal direction D23, one of the second segments 24 may be movable in a horizontal direction D24, one of the first segments 22 may be movable in a horizontal direction D25, one of the second segments 24 may be movable in a horizontal direction D26, one of the first segments 22 may be movable in a horizontal direction D27, and one of the second segments 24 may be movable in a horizontal direction D28, but not limited thereto. The horizontal directions D21-D28 may be regarded as radial directions outwards from the central axis AX, but not limited thereto. In other words, the first segments 22 and the second segments 24 may be moved towards the central axis AX or away from the central axis AX respectively. In some embodiments, a distance between the central axis AX and an inner edge E1 of each of the first segments 22 in one of the horizontal directions described above may be substantially equal to a distance between central axis AX and an inner edge E2 of each of the second segments 24 in one of the horizontal directions described above for controlling the area of the substrate 12 overlapped by the mask structure 20, but not limited thereto. In some embodiments, the distance between the central axis AX and the inner edge E1 of each of the first segments 22 may be substantially equal to the distance between central axis AX and the inner edge E2 of each of the second segments 24 with a tolerance of ±2%, for example. In other words, the distance between the central axis AX and the inner edge E1 of each of the first segments 22 may be equal to the distance between central axis AX and the inner edge E2 of each of the second segments 24 preferably, but the distance between the central axis AX and the inner edge E1 of each of the first segments 22 may range from 0.98 times the distance between central axis AX and the inner edge E2 of each of the second segments 24 to 1.02 times the distance between central axis AX and the inner edge E2 of each of the second segments 24 because of the unavoidable error in operation. In some embodiments, the distance between the central axis AX and the inner edge E1 of each of the first segments is at least partially equal to the distance between the central axis AX and the inner edge E2 of each of the second segments.

Figure 3:
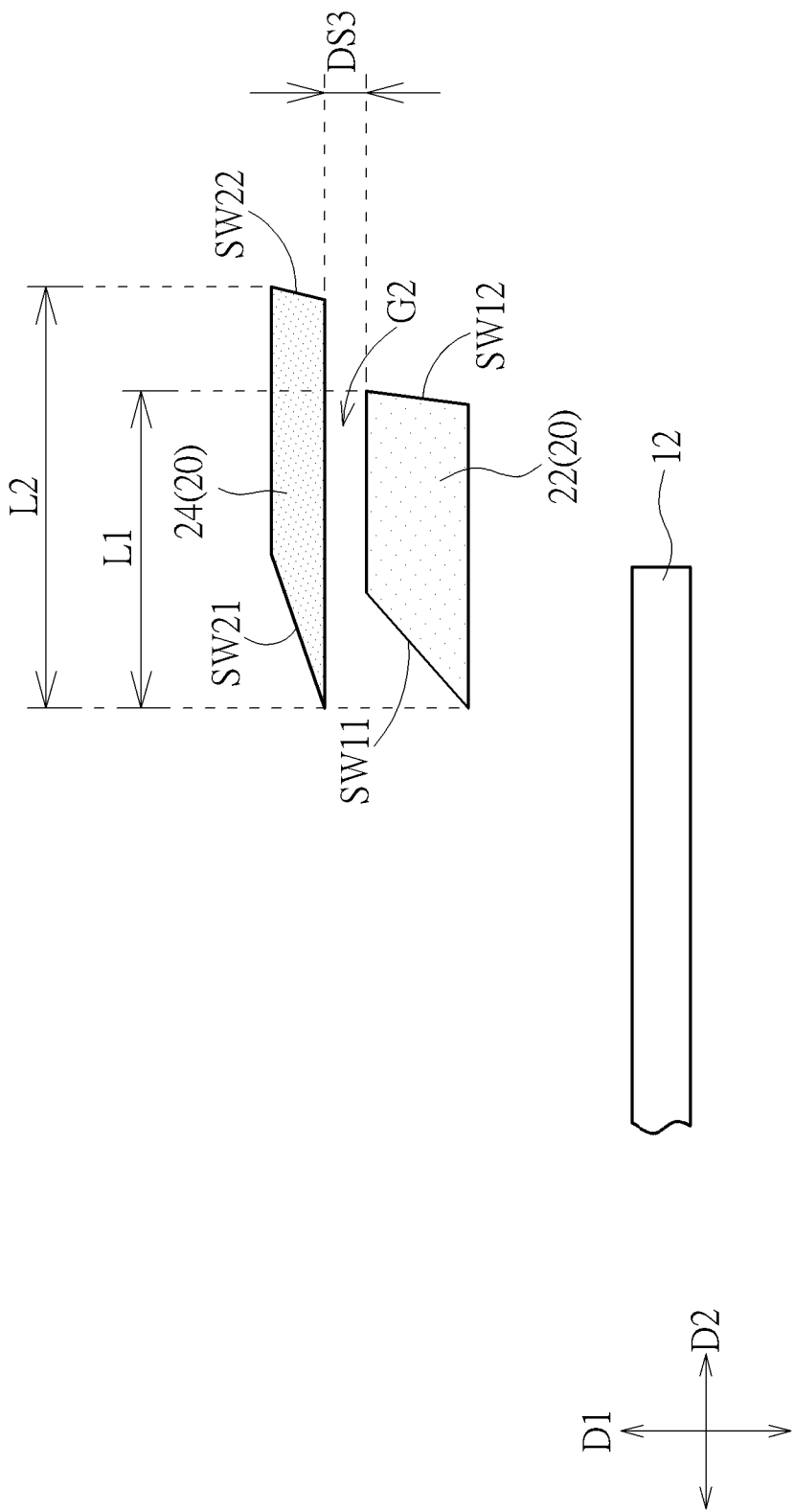
FIG. 3 is a schematic drawing illustrating a cross-sectional view of the mask structure for the deposition device according to the first embodiment of the present invention.

FIG. 3 is a schematic drawing illustrating a cross-sectional view of the mask structure 20 for the deposition device according to the first embodiment of the present invention. As illustrated in FIGS. 1-3, in some embodiments, a length L1 of each of the first segments 22 in the horizontal direction may be less than a length L2 of each of the second segments 24 in the horizontal direction for saving space for the second supporting structure 34 and/or avoiding the deposited film accumulating on the path for moving the second segments 24 horizontally, but not limited thereto. In some embodiments, an inner sidewall SW11 of each of the first segments 22 and an inner sidewall SW21 of each of the second segments 24 may be oblique respectively for keeping the deposited film formed thereon from peeling of the inner sidewalls SW11 and the inner sidewalls SW21, and an outer sidewall SW12 of each of the first segments 22 and an outer sidewall SW22 of each of the second segments 24 may be oblique for reducing the total amount of the deposited film formed on the first segments 22 and the second segments 24. Additionally, in this description, a distance between the central axis AX and a relatively inner location and/or a relatively inner part in the horizontal direction is less than a distance between the central axis AX and a relatively outer location and/or a relatively outer part in the horizontal. The inner portion of each object may be closer to the central axis AX in the horizontal than the outer portion of this object.

In addition, the slope of the inner sidewall SW11 may be different from the slope of the inner sidewall SW21 for reducing the difference in the deposited amounts between the deposited film formed on each first segment 22 and the deposited film formed on each second segment 24, especially when the projection area of each first segment 22 in the vertical direction D1 is different from the projection area of each second segment 24 in the vertical direction D1. For example, the slope of the inner sidewall SW21 may be smaller than the slope of the inner sidewall SW11, and an included angle between the inner sidewall SW21 and a bottom surface of the second segment 24 may be smaller than an included angle between the inner sidewall SW11 and a bottom surface of the first segment 22, but not limited thereto. However, the shapes of the first segment 22 and the second segment 24 in the present invention are not limited to those represented in FIG. 3, and other suitable shapes may also be applied according to other design considerations. In addition, a gap G2 may exist between the first segment 22 and the second segment 24 in the vertical direction D1 for separating the first segment 22 from the second segment 24, and a distance DS3 between the first segment 22 and the second segment 24 in the vertical direction D1 may be adjusted for reducing the influence of the second segments 24 on controlling the film suppression area described above. For example, the distance DS3 between the first segment 22 and the second segment 24 in the vertical direction D1 may range from 0.01 to 6 mm, but not limited thereto.

Figure 4:
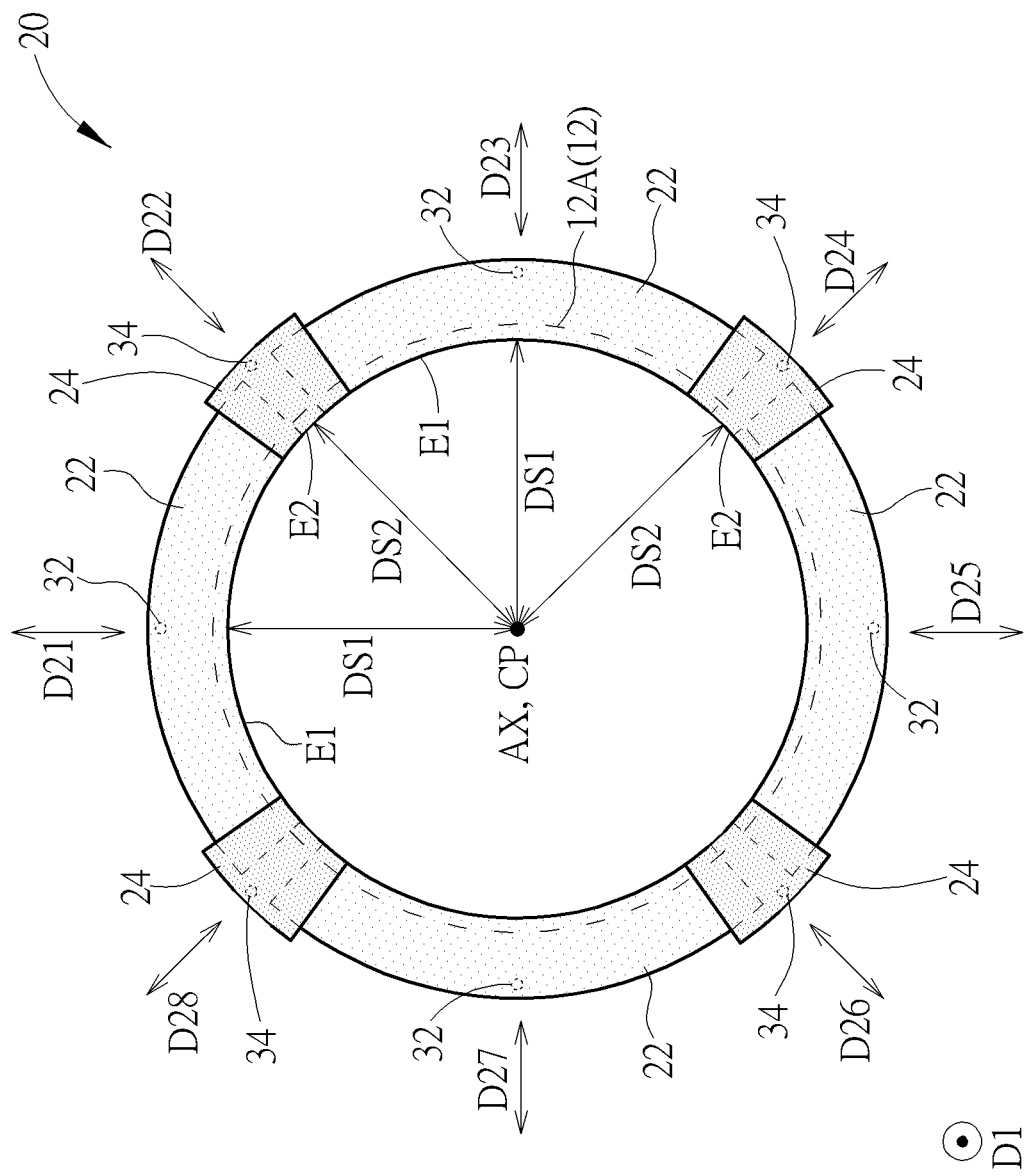
Figure 5:
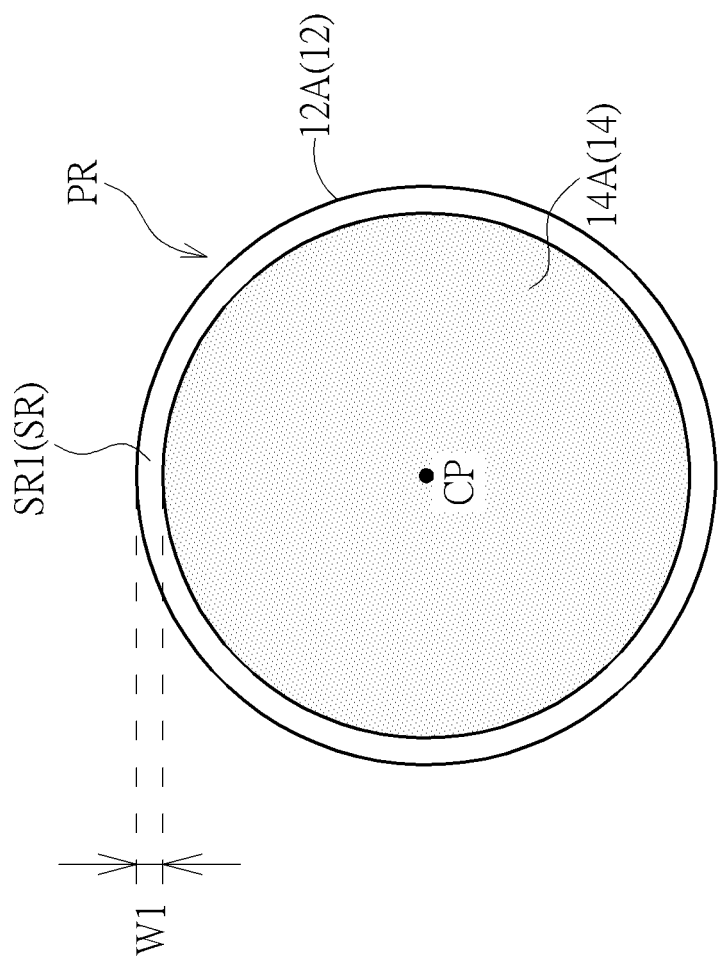
Figure 6:
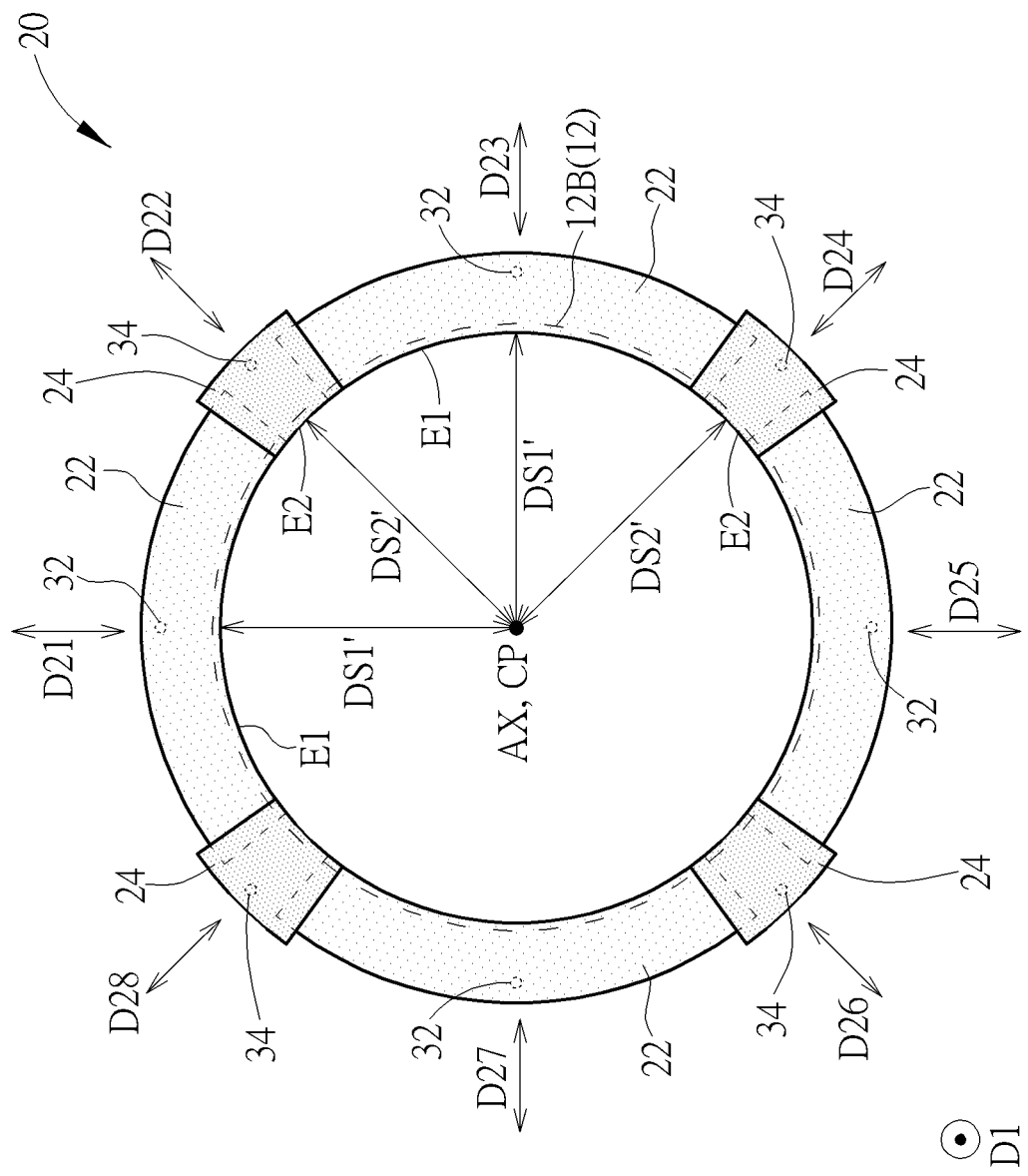
Figure 7:
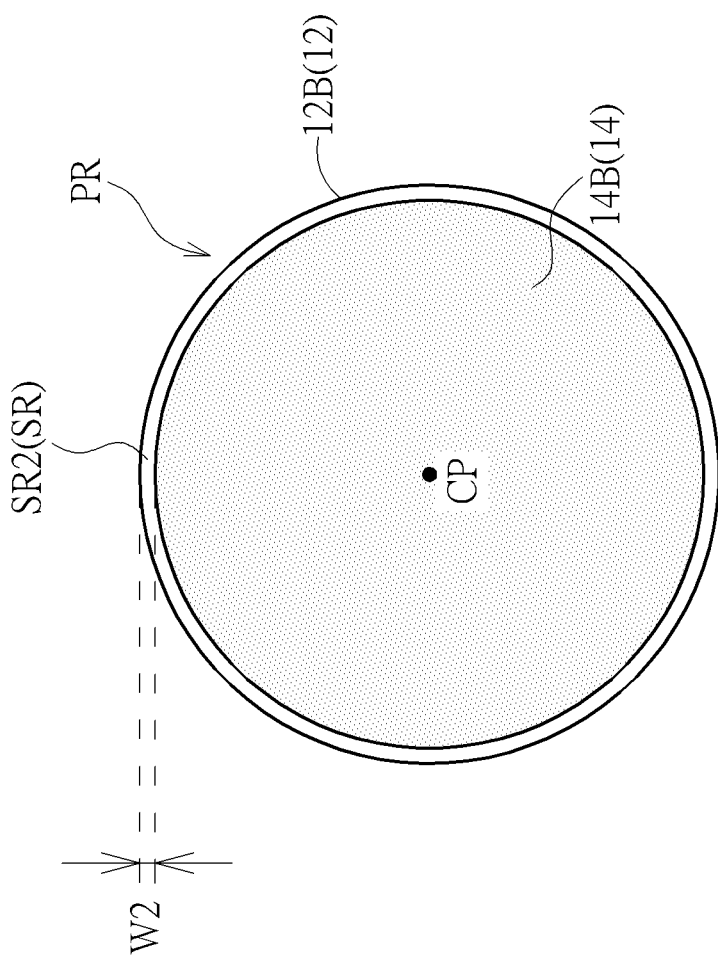

FIGS. 4-7 are schematic drawings illustrating an operation method of the deposition device in this embodiment, wherein FIG. 4 is a schematic drawing illustrating positions of the mask structure 20 and a first substrate 12A in a first deposition process, FIG. 5 is a schematic drawing illustrating the first substrate 12A after the first deposition process, FIG. 6 is a schematic drawing illustrating positions of the mask structure 20 and a second substrate 12B in a second deposition process, and FIG. 7 is a schematic drawing illustrating the second substrate 12B after the second deposition process. As illustrated in FIG. 1 and FIGS. 4-7, the operation method of the deposition device 100 may include but is not limited to the following steps. Firstly, the deposition device 100 described above may be provided. Subsequently, deposition processes may be performed to a plurality of the substrates 12 respectively. For example, as illustrated in FIG. 1, FIG. 4 and FIG. 5, a first deposition process may be performed to a first substrate 12A by the deposition device 100 for forming a deposited film 14A on the first substrate 12A, and a first film suppression area SR1 may be formed on a peripheral region PR of the first substrate 12A after the first deposition process. The deposited film 14A is kept from being formed on the first film suppression area SR1 by the mask structure 20 covering at least a part of the peripheral region PR of the first substrate 12A in the first deposition process, and the first film suppression area SR1 may be formed corresponding to the positions of the first segments 22 and the second segments 24 in the first deposition process accordingly. As illustrated in FIG. 1, FIG. 6 and FIG. 7, a second deposition process may be performed to a second substrate 12B by the deposition device 100 for forming a deposited film 14B on the second substrate 12B, and a second film suppression area SR2 may be formed on a peripheral region PR of the second substrate 12B after the second deposition process. The deposited film 14B is kept from being formed on the second film suppression area SR2 by the mask structure 20 covering at least a part of the peripheral region PR of the second substrate 12B in the second deposition process, and the second film suppression area SR2 may be formed corresponding to the positions of the first segments 22 and the second segments 24 in the second deposition process accordingly. In some embodiments, the mask structure 20 is separated from the substrate 12 without directly contacting the substrate 12 for protecting the substrate 12 and/or the material formed on the substrate 12.

As illustrated in FIG. 1 and FIGS. 4-7, in some embodiments, a central point CP of the substrate 12 disposed on the stage 10 may overlap the central axis AX in the vertical direction D1 during the deposition process (such as the first deposition process and the second deposition process described above), and a distance between the inner edge E1 of one of the first segments 22 and the central axis AX may be substantially equal to a distance between the inner edge of one of the second segments 24 and the central axis AX in each deposition process. For example, in the first deposition process (as illustrated in FIG. 4), a distance DS1 between the central axis AX and the inner edge E1 of each of the first segments 22 in the horizontal direction may be substantially equal to the distance DS2 between central axis AX and the inner edge E2 of each of the second segments 24 in the horizontal direction. In other words, the distance DS1 between the central axis AX and the inner edge E1 of each of the first segments 22 pointed at an arcuate shape in the horizontal direction may be at least partially equal to the distance DS2 between central axis AX and the inner edge E2 of each of the second segments 24 pointed at an arcuate shape in the horizontal direction. In the second deposition process (as illustrated in FIG. 6), a distance DS1' between the central axis AX and the inner edge E1 of each of the first segments 22 in the horizontal direction may be substantially equal to the distance DS2' between central axis AX and the inner edge E2 of each of the second segments 24 in the horizontal direction. In other words, the distance DS1' between the central axis AX and the inner edge E1 of each of the first segments 22 pointed at an arcuate shape in the horizontal direction may be at least partially equal to the distance DS2' between central axis AX and the inner edge E2 of each of the second segments 24 pointed at an arcuate shape in the horizontal direction.

In some embodiments, the positions of the first segments 22 and the second segments 24 may be horizontally adjusted respectively between different deposition processes (such as the first deposition process and the second deposition process described above). For example, in some embodiments, the first deposition process may be performed before the second deposition process, and the first segments 22 and the second segments 24 may be moved away from the central axis AX respectively after the first deposition process and before the second deposition process for reducing the area of the substrate 12 overlapped by the mask structure 20 in the second deposition process. In other words, the distance DS1 between the inner edge E1 of one of the first segments 22 and the central axis AX in the first deposition process may be different from the distance DS1' between the inner edge E1 of the first segment 22 and the central axis AX in the second deposition process, and the distance DS2 between the inner edge E2 of one of the second segments 24 and the central axis AX in the first deposition process may be different from the distance DS2' between the inner edge E2 of the second segment 24 and the central axis AX in the second deposition process. In some embodiments, a width W1 of the first film suppression area SR1 formed on the first substrate 12A may be greater than a width W2 of the second film suppression area SR2 formed on the second substrate 12B accordingly, but not limited thereto. In other words, the second film suppression area SR2 is different from the first film suppression area SR1, but not limited thereto.

In some embodiments, the first deposition process may be performed after the second deposition process, and the first segments 22 and the second segments 24 may be moved towards the central axis AX respectively after the second deposition process and before the first deposition process for increasing the area of the substrate 12 overlapped by the mask structure 20 in the first deposition process. In other words, the first segments 22 and the second segments 24 may be moved towards the central axis AX or away from the central axis AX respectively for controlling the film suppression area SR formed on each of the substrates 12. In some embodiments, the width W1 of the first film suppression area SR1 may be different from the width W2 of the second film suppression area SR2 by horizontally adjusting the positions of the first segments 22 and the second segments 24 respectively between the first deposition process and the second deposition process. In other words, the deposition processes with different requirements in the film suppression area may be performed successively in the deposition device of the present invention without being interrupted by changing the conventional clamp ring for different deposition processes. The throughput of the deposition device may be enhanced accordingly.

Figure 8:
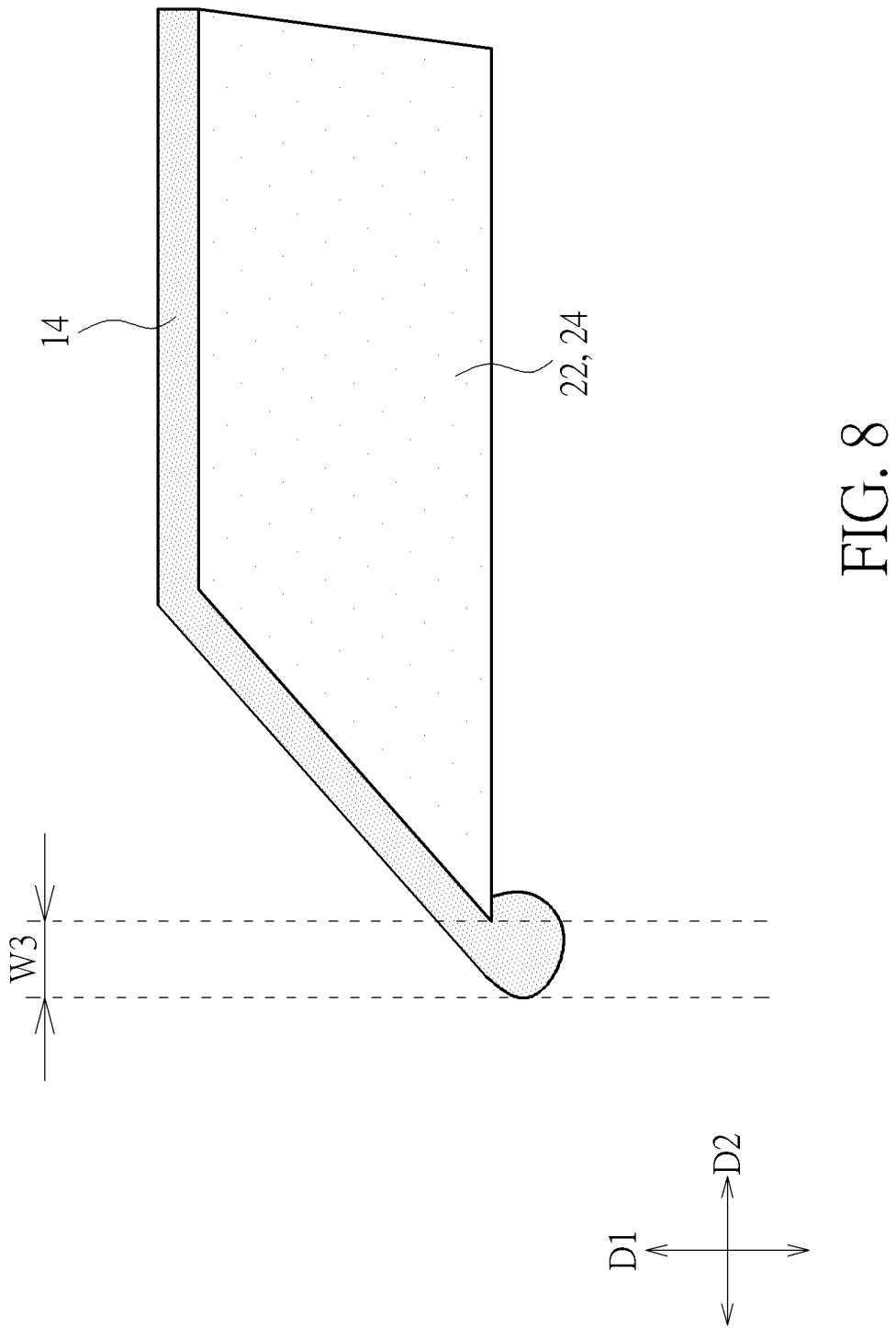
FIG. 8 is a schematic drawing illustrating the mask structure after deposition processes according to an embodiment of the present invention.

FIG. 8 is a schematic drawing illustrating the mask structure after deposition processes according to an embodiment of the present invention. As illustrated in FIG. 8, the deposited film 14 may accumulate on the first segment 22 and the second segment 24 after a plurality of the deposition processes, and the deposited film 14 accumulating at the inner edges of the first segment 22 and the second segment 24 may influence the overlapped area on the substrate in the deposition process. Therefore, in some embodiments, the positions of the first segments and the second segments may be horizontally adjusted respectively between different deposition processes for keeping the film suppression area formed on each of the substrate substantially unchanged. For example, as illustrated in FIGS. 4-8, in some embodiments, the first deposition process may be performed before the second deposition process, and the first segments 22 and the second segments 24 may be moved away from the central axis AX respectively after the first deposition process and before the second deposition process for keeping the area of the second substrate 12B overlapped by the mask structure 20 and the deposited film 14 formed on the mask structure 20 in the second deposition process substantially the same as the area of the first substrate 12A overlapped by the mask structure 20 and the deposited film 14 formed on the mask structure 20 in the first deposition process. In other words, the width W1 of the first film suppression area SR1 may be substantially equal to the width W2 of the second film suppression area SR2 when the positions of the first segments 22 and the second segments 24 are horizontally adjusted after the first deposition process and before the second deposition process. In some embodiments, the width W1 of the first film suppression area SR1 may be substantially equal to the width W2 of the second film suppression area SR2 with a tolerance of ±10%, for example. In other words, the width W1 may be equal to the width W2, or the width W1 may range from 0.9 times the width W2 to 1.1 times the width W2 because of the unavoidable process variations. For example, in order to be enclosed in a target of the tolerance, the number of the first segments 22 and the number of the second segments 24 in the mask structure 20 may be increased to be more than 4, respectively, but not limited thereto.

In some embodiments, the positions of the first segments 22 and the second segments 24 may be horizontally adjusted in accordance with the deposited film 14 accumulating at the inner edges of the first segment 22 and the second segment 24 after deposition processes performed between the first deposition process and the second deposition process. For example, in some embodiments, a width W3 of the deposited film 14 accumulating at the inner edges of the first segment 22 and/or the second segment 24 may be calculated by multiplying the cumulative power consumption of the deposition device by a coefficient, and the first segments 22 and the second segments 24 may be moved away from the central axis AX by a distance corresponding the width W3, but not limited thereto. In some embodiments, the positions of the first segments 22 and the second segments 24 may be gradually adjusted between the deposition processes performed between the first deposition process and the second deposition process, but not limited thereto. In some embodiments, the calculated width W3 of the deposited film 14 accumulating at the inner edges of the first segment 22 and/or the second segment 24 may be used as a reference for deciding whether the mask structure 20 has to be replaced and/or cleaned or not.

Figure 9:
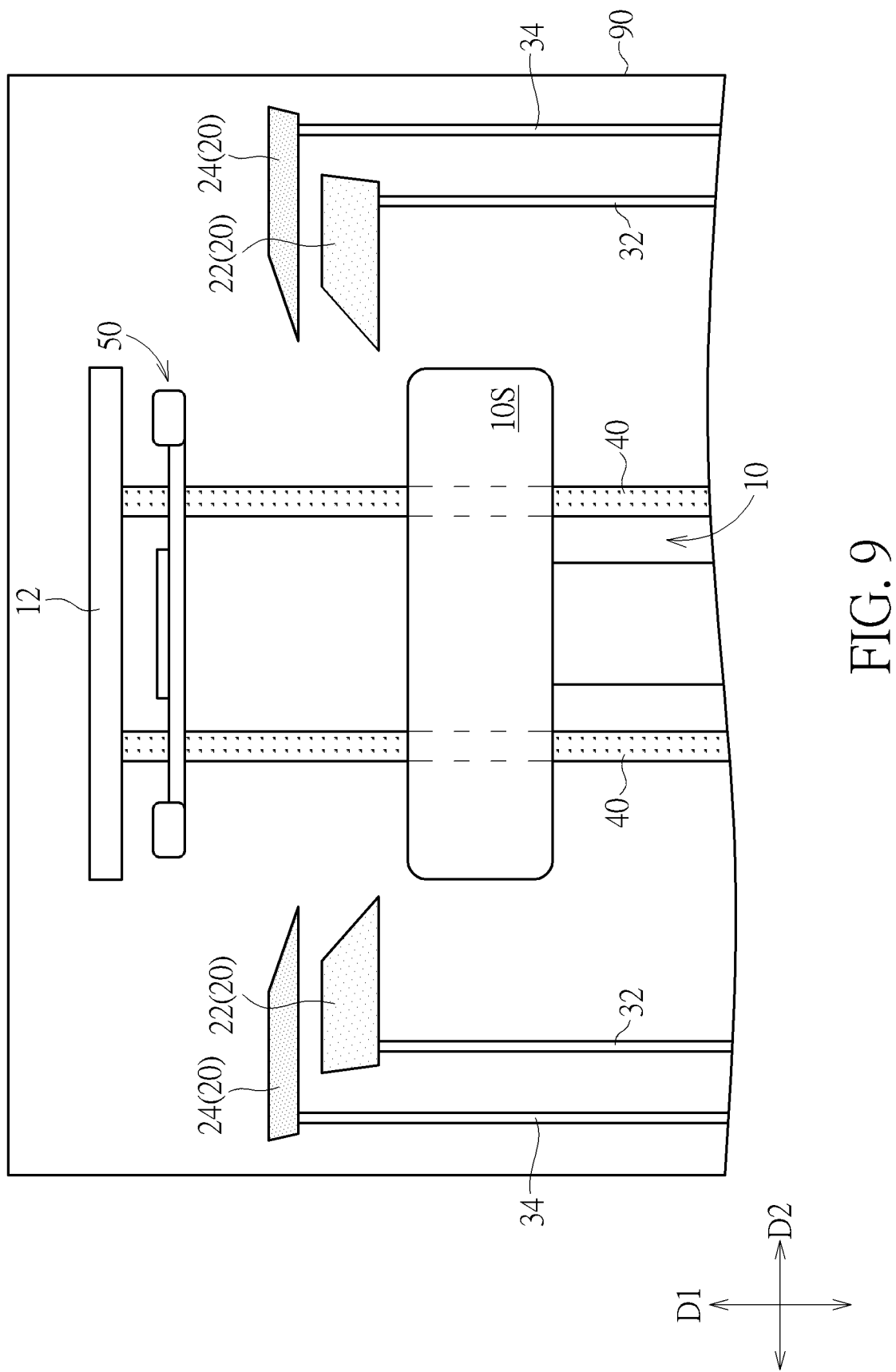
FIG. 9 is a schematic drawing illustrating a loading operation in the operation method of the deposition device according to the first embodiment of the present invention.
Figure 10:
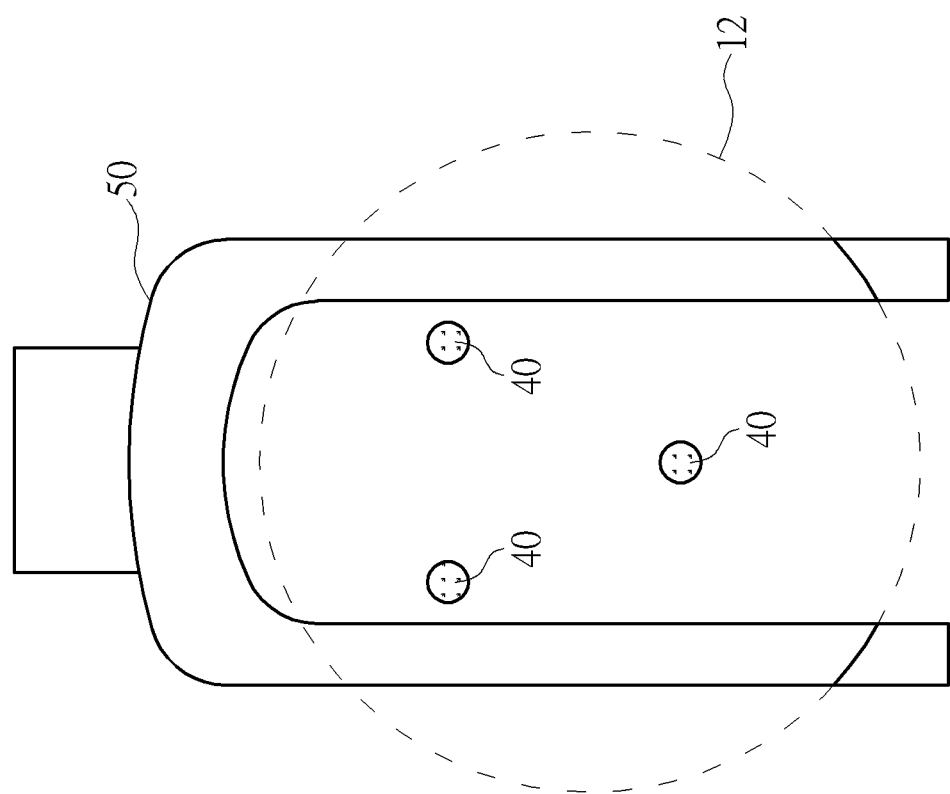
FIG. 10 is a top view schematic drawing illustrating a loading operation in the operation method of the deposition device according to the first embodiment of the present invention.

FIG. 9 is a schematic drawing illustrating a loading operation in the operation method of the deposition device according to the first embodiment of the present invention, and FIG. 10 is a top view schematic drawing illustrating the loading operation in the operation method of the deposition device according to the first embodiment of the present invention. As illustrated in FIG. 9 and FIG. 10, the deposition device may further include a plurality of lifting structures 40 and a loading structure 50. In some embodiments, the lifting structures 40 may be movable vertically for lifting the substrate 12 or putting the substrate 12 on the holding structure 10S, and the loading structure 50 may be used to transfer the substrate 12 into the process chamber 90 and transfer the substrate 12 out of the process chamber 90. In the loading operation according to an embodiment of the present invention, the lifting structures 40 may penetrate through the holding structure 10S for lifting the substrate 12 up to a position away from the holding structure 10S, and the loading structure 50 may extend to the space between the substrate 12 and the holding structure 10S for transferring the substrate 12 out of the process chamber 90 after a deposition process performed to the substrate 12. Similarly, a substrate 12 may be transferred into the process chamber 90 and be placed on the lifting structures 40 by the loading structure 50, and the lifting structures 40 may then move downwards for putting the substrate 12 on the holding structure 10S after the loading structure 50 is moved out of the process chamber 90. In some embodiments, the first segments 22 and the second segments 24 of the mask structure 20 may be moved horizontally and/or vertically by the first supporting structures 32, the second supporting structures 34, and/or other mechanical structures (not represented in the figures) for avoiding interfering with the loading operation described above. For example, the first segments 22 and the second segments 24 of the mask structure 20 may be moved horizontally for avoiding overlapping the substrate 12 in the vertical direction D1, and the position of the substrate 12 lifted by the lifting structures 40 may be higher than the position of the mask structure 20 in the vertical direction D1 during the loading operation described above, but not limited thereto. In some embodiments, the first segments 22 and the second segments 24 of the mask structure 20 may be moved away from the central axis AX without being moved upwards for the loading operation described above, or be moved away from the central axis AX and moved upwards slightly for the loading operation described above.

It is worth noting that the loading operation in the operation method of the deposition device according to the present invention is not limited to the approach described above and other suitable loading operations may also be applied in the operation method of the deposition device according to the present invention.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 11:
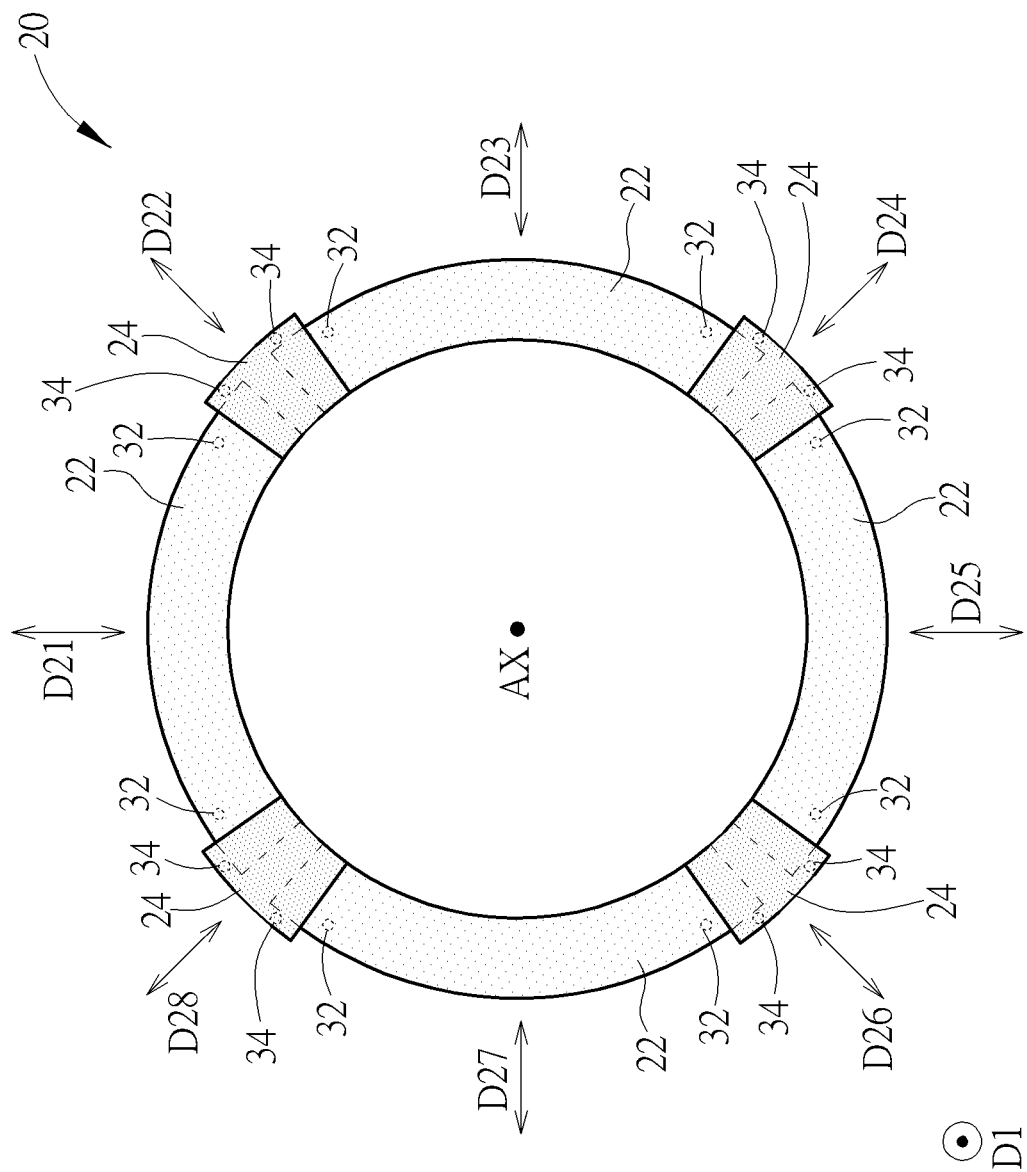
FIG. 11 is a schematic drawing illustrating a top view of a mask structure for a deposition device according to a second embodiment of the present invention.

FIG. 11 is a schematic drawing illustrating a top view of a mask structure for a deposition device according to a second embodiment of the present invention. As illustrated in FIG. 11, in the deposition device of this embodiment, more than one of the first supporting structures 32 may be connected to one of the first segments 22, and more than one of the second supporting structures 34 may be connected to one of the second segments 24 for improving the supporting performance for the first segments 22 and the second segments 24. In some embodiments, the second supporting structures 34 may be disposed under the outer portion of the corresponding second segment 24 for avoiding interfering with the movements of the first segments 22, but not limited thereto.

Figure 12:
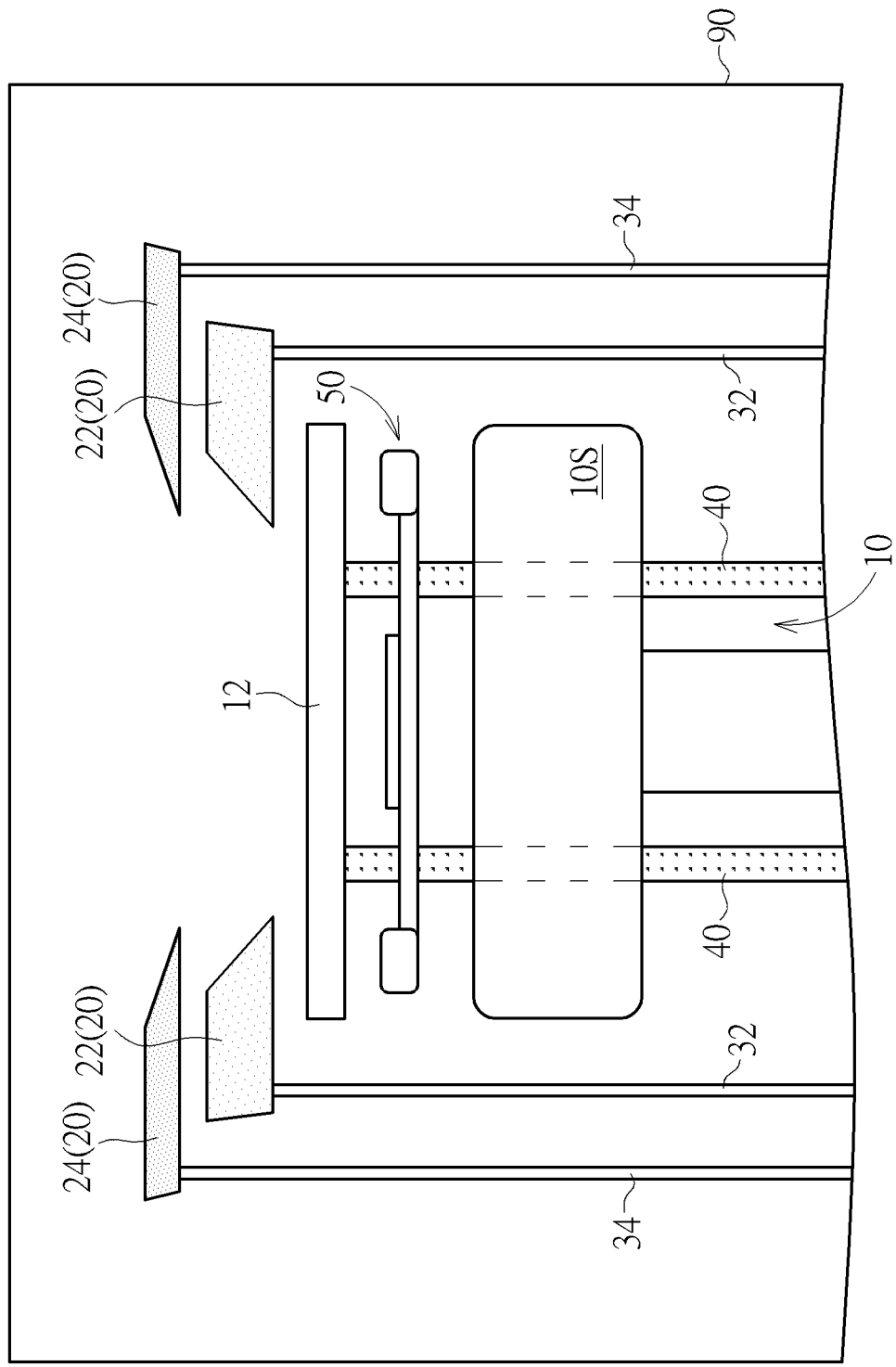
FIG. 12 is a schematic drawing illustrating a loading operation in an operation method of a deposition device according to a third embodiment of the present invention.
Figure 13:
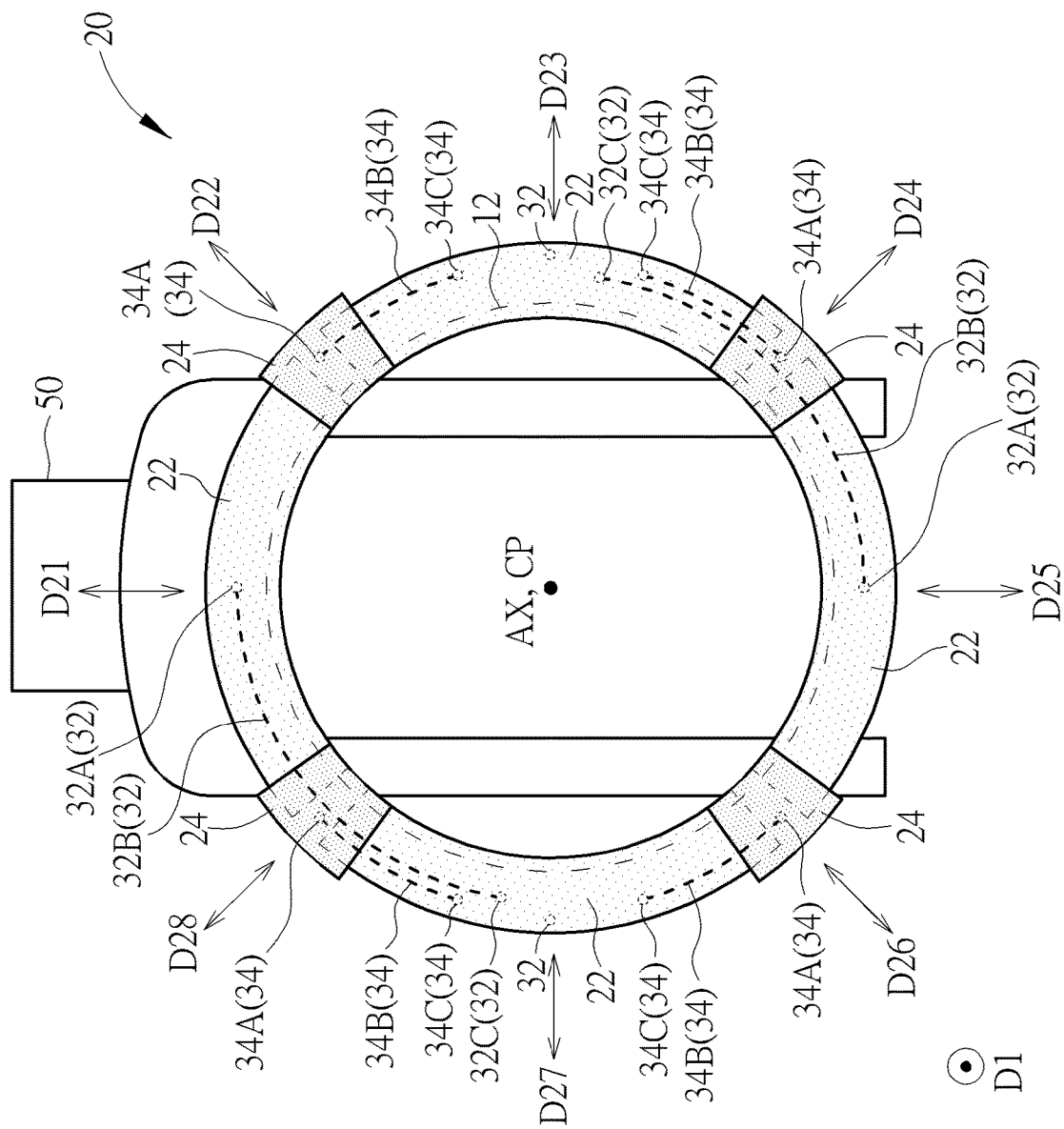
FIG. 13 is a top view schematic drawing illustrating a loading operation in the operation method of the deposition device according to the third embodiment of the present invention.
Figure 14:
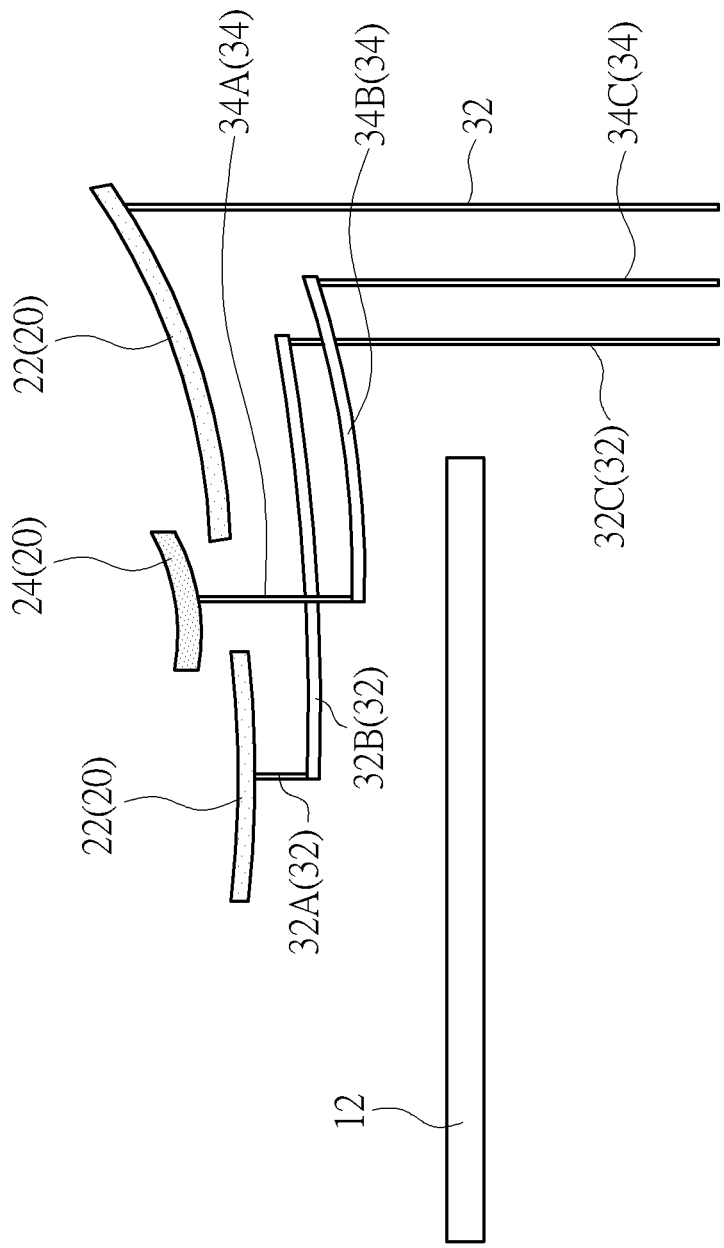
FIG. 14 is a schematic drawing illustrating a portion of a mask structure for the deposition device according to the third embodiment of the present invention.

FIG. 12 is a schematic drawing illustrating a loading operation in an operation method of the deposition device according to a third embodiment of the present invention, FIG. 13 is a top view schematic drawing illustrating the loading operation in the operation method of the deposition device in this embodiment, and FIG. 14 is a schematic drawing illustrating a portion of the mask structure 20 for the deposition device in this embodiment. As illustrated in FIG. 12 and FIG. 13, in the loading operation of this embodiment, the lifting structures 40 may penetrate through the holding structure 10S for lifting the substrate 12 up to a position away from the holding structure 10S, and the loading structure 50 may extend to the space between the substrate 12 and the holding structure 10S for transferring the substrate 12 out of the process chamber 90 after a deposition process performed to the substrate 12. Similarly, a substrate 12 may be transferred into the process chamber 90 and be placed on the lifting structures 40 by the loading structure 50, and the lifting structures 40 may then move downwards for putting the substrate 12 on the holding structure 10S after the loading structure 50 is moved out of the process chamber 90. In some embodiments, the first segments 22 and the second segments 24 of the mask structure 20 may be moved horizontally by the first supporting structures 32, the second supporting structures 34, and/or other mechanical structures before the loading operation described above. For example, the first segments 22 and the second segments 24 of the mask structure 20 may be moved upwards and overlap the substrate 12 in the vertical direction D1 still, and the position of the substrate 12 lifted by the lifting structures 40 may be lower than the position of the mask structure 20 in the vertical direction D1 during the loading operation described above, but not limited thereto.

As illustrated in FIG. 13 and FIG. 14, in this embodiment, a part of one of the first supporting structures 32 may be disposed under one of the first segments 22 in the vertical direction D1, and a part of one of the second supporting structures 34 may be disposed under one of the second segments 24 in the vertical direction D1 for avoiding interfering with the loading operation described above. For example, in some embodiments, one of the first supporting structures 32 may include a first portion 32A, a second portion 32B, and a third portion 32C, and each of the second supporting structures 34 may include a first portion 34A, a second portion 34B, and a third portion 34C. The first portion 32A of the first supporting structure 32 may be elongated in the vertical direction D1 and disposed under the corresponding first segment 22; the second portion 32B of the first supporting structure 32 may be elongated in the direction surrounding the central axis AX and be disposed partly under the corresponding first segment 22, partly under one of the second segments 24, and partly under another first segment 22 adjacent to the corresponding first segment 22; and the third portion 32C of the first supporting structure 32 may be elongated in the vertical direction D1 and disposed under the another first segment 22 adjacent to the corresponding first segment 22. The first portion 32A may be directly connected with the corresponding first segment 22, and the second portion 32B may be disposed between the first portion 32A and the third portion 32C for connecting the first portion 32A with the third portion 32C. Additionally, the first portion 34A of the second supporting structure 34 may be elongated in the vertical direction D1 and disposed under the corresponding second segment 24; the second portion 34B of the second supporting structure 34 may be elongated in the direction surrounding the central axis AX and be disposed partly under the corresponding second segment 24 and partly under one of the first segments 22 adjacent to the corresponding second segment 24; and the third portion 34C of the second supporting structure 34 may be elongated in the vertical direction D1 and disposed under the one of the first segment 22 adjacent to the corresponding second segment 24. The first portion 34A may be directly connected with the corresponding second segment 24, and the second portion 34B may be disposed between the first portion 34A and the third portion 34C for connecting the first portion 34A with the third portion 34C.

By modifying the structures of at least some of the first supporting structures 32 and at least some of the second supporting structures 34 as illustrated in FIG. 13 and FIG. 14, the motion of the loading structure 50 and the substrate 12 disposed on the loading structure 50 during the loading operation described above will not be interfered with by the first supporting structures 32 and the second supporting structures 34. Accordingly, the first segments 22 and the second segments 24 of the mask structure 20 may not be moved away from the central axis AX to the positions without overlapping the substrate 12 in the vertical direction D1 for the loading operation described above, and the size of the process chamber 90 in this embodiment may be reduced accordingly. In some embodiments, the first segments 22 and the second segments 24 of the mask structure 20 may be moved upwards without being moved away from the central axis AX for the loading operation described above, or be moved upwards and moved away from the central axis AX slightly for the loading operation described above.

Figure 15:
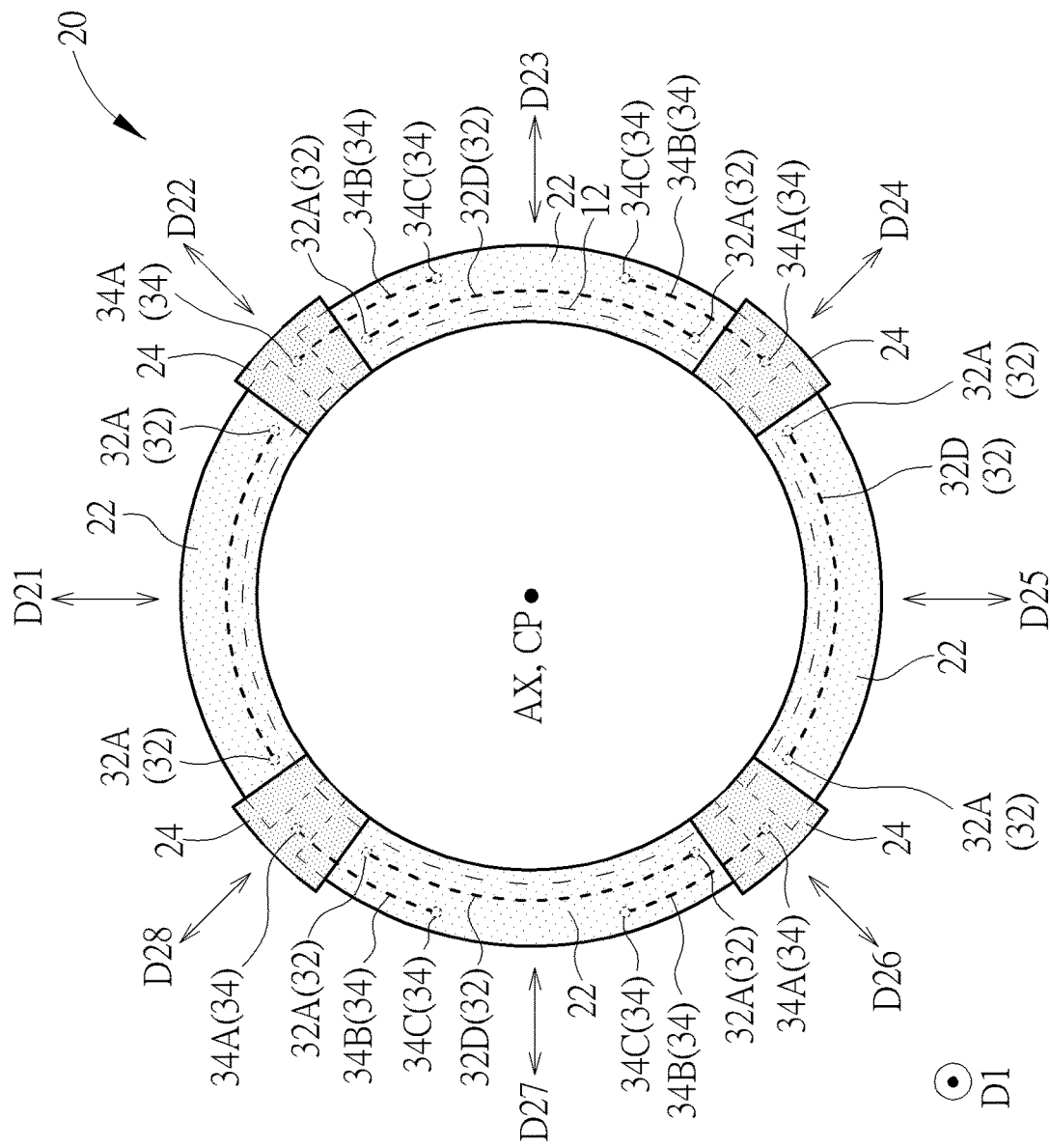
FIG. 15 is a schematic drawing illustrating a top view of a mask structure for a deposition device according to a fourth embodiment of the present invention.
Figure 16:
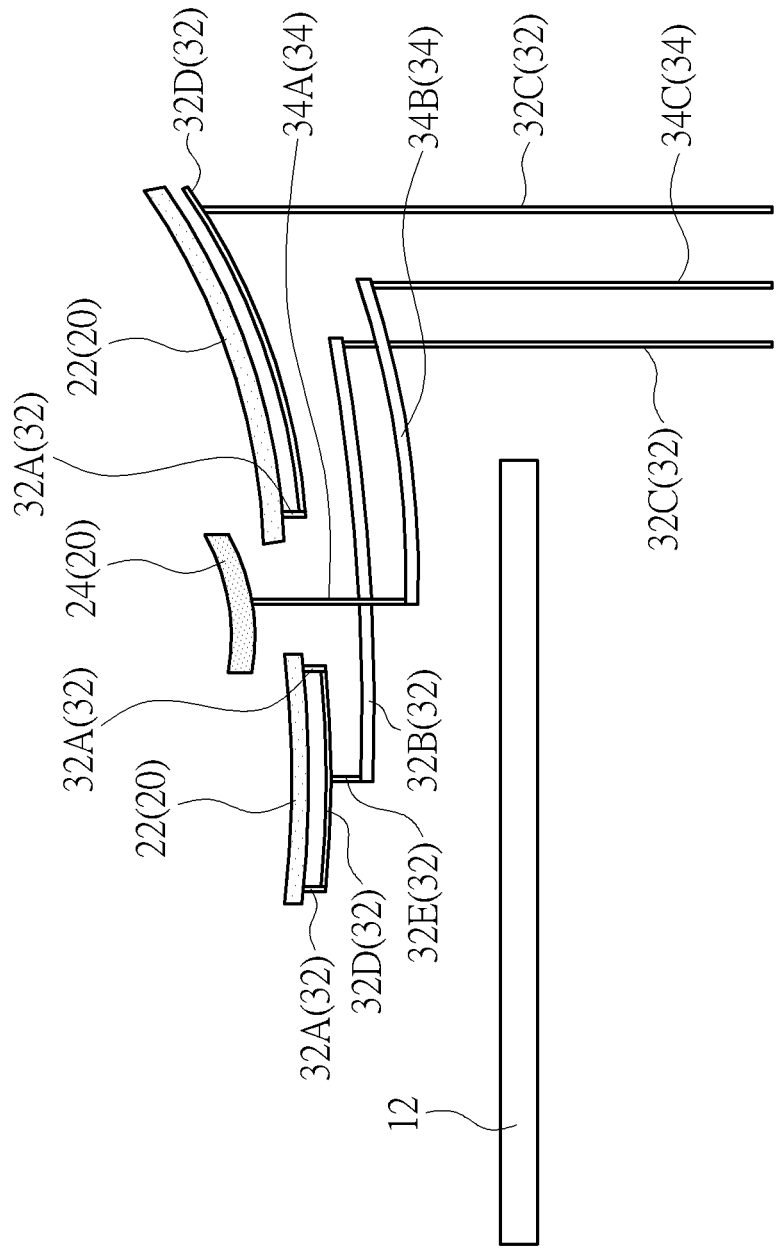
FIG. 16 is a schematic drawing illustrating a portion of the mask structure for the deposition device according to the fourth embodiment of the present invention.

FIG. 15 is a schematic drawing illustrating a top view of the mask structure 20 for the deposition device according to a fourth embodiment of the present invention, and FIG. 16 is a schematic drawing illustrating a portion of the mask structure 20 in this embodiment. As illustrated in FIG. 15 and FIG. 16, one of the first supporting structures 32 may include two first portions 32A, the second portion 32B, the third portion 32C, a fourth portion 32D, and a fifth portion 32E. For the simplicity of the figures, the second portion 32B, the third portion 32C, and the fifth portion 32E depicted in FIG. 16 is not represented in FIG. 15. In some embodiments, the fourth portion 32D of the first supporting structure 32 may be elongated in the direction surrounding the central axis AX and be disposed under the corresponding first segment 22, and the fifth portion 32E of the first supporting structure 32 may be elongated in the vertical direction D1 and disposed between the fourth portion 32D and the second portion 32B. The fourth portion 32D may be connected with the two first portions 32A respectively, and the fifth portion 32E may be connected to the fourth portion 32D and the second portion 32B respectively. The supporting strength and/or supporting stability of the first supporting structure 32 may be enhanced by disposing a plurality of the first portions 32A connected to one of the first segment 22.

Figure 17:
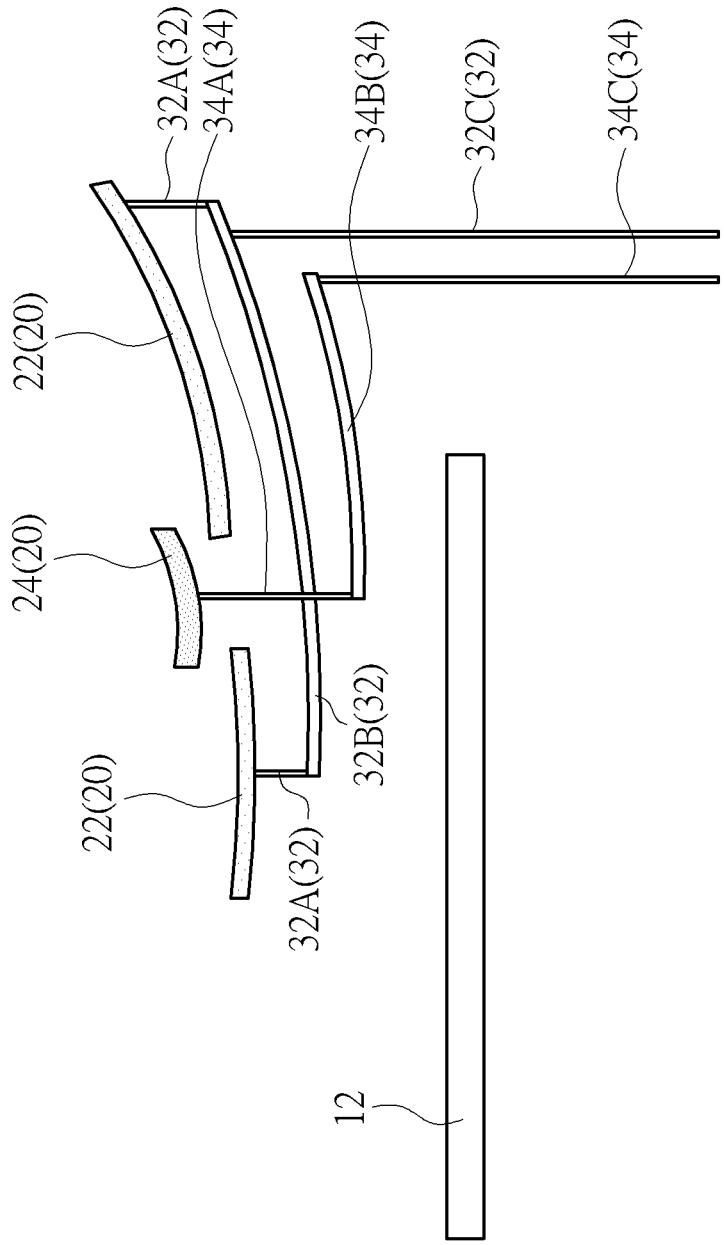
FIG. 17 is a schematic drawing illustrating a portion of a mask structure for a deposition device according to a fifth embodiment of the present invention.

FIG. 17 is a schematic drawing illustrating a portion of a mask structure for a deposition device according to a fifth embodiment of the present invention. As illustrated in FIG. 17, the first supporting structure 32 may be connected to two of the first segments 22 disposed adjacent to each other. For example, the first supporting structure 32 may include two first portions 32A connected to two of the first segments 22 disposed adjacent to each other respectively, and the second portion 32B of the first supporting structure 32 may be connected to the two first portions 32A. In some embodiments, at least one of the first supporting structures 32 may be connected to two of the first segments 22 disposed adjacent to each other for simplifying the first supporting structures 32 and avoiding interfering with the loading operation described above. In some embodiments, the second portion 32B may be capable of expanding and contracting for horizontally moving the different first segments 22 connected to this second portion 32B appropriately and keeping the width of the corresponding film suppression area constant.

Figure 18:
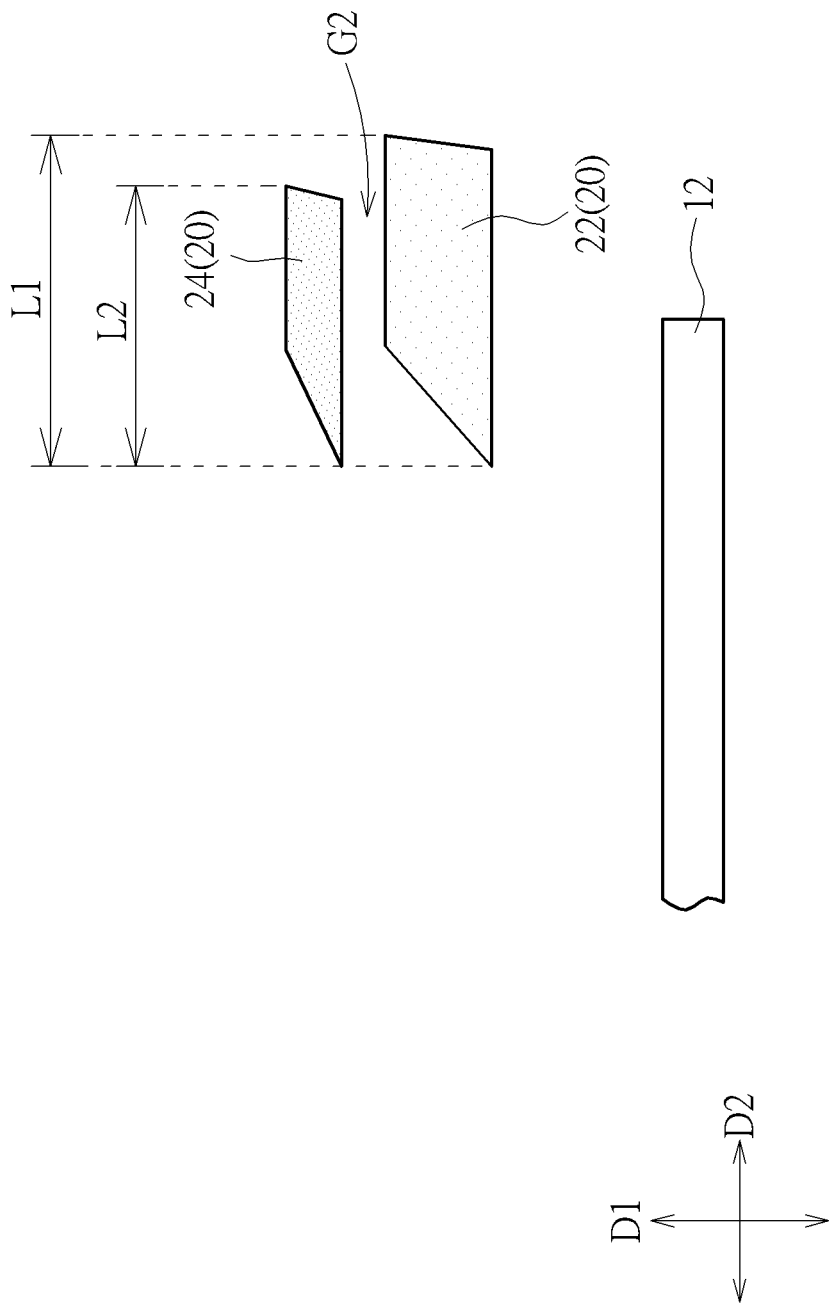
FIG. 18 is a schematic drawing illustrating a portion of a mask structure for a deposition device according to a sixth embodiment of the present invention.

FIG. 18 is a schematic drawing illustrating a portion of the mask structure 20 for the deposition device according to a sixth embodiment of the present invention. As illustrated in FIG. 18, in this embodiment, the length L1 of the first segment 22 in the horizontal direction may be greater than the length L2 of the second segment 24 in the horizontal direction, and the second supporting structure corresponding to the second segment 24 may be disposed between two adjacent first segments 22. In some embodiments, an outer peripheral size of each of the first segments 22 may be larger than an outer peripheral size of each of the second segments 24 in a horizontal direction (a radial direction in a horizontal plane orthogonal to the vertical direction D1). In some embodiments, for avoiding the deposited film accumulating on the first segment 22 from interfering with the path for moving the second segment 24 horizontally, the frequency of cleaning the mask structure 20 may be increased and/or the gap G2 between the first segment 22 and the second segment 24 in the vertical direction D1 may become larger relatively, but not limited thereto. In some embodiments, the size of the process chamber 90 may be reduced and the second segment 24 may be lighter because the second segment 24 becomes relatively smaller, but not limited thereto.

To summarize the above descriptions, according to the mask structure for the deposition device, the deposition device, and the operation method of the deposition device in the present invention, the mask structure including the first segments separated from one another and the second segments overlapping the first segments adjacent to each other is used for controlling the film suppression area on the substrate in the deposition process more precisely and more conveniently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operation method of a deposition device, comprising:
   providing a deposition device, wherein the deposition device comprises:
   a process chamber;
   a stage at least partially disposed in the process chamber and comprising a holding structure of a substrate; and
   a mask structure disposed in the process chamber, being located over the stage, and covering a peripheral region of the substrate to be held on the stage, wherein the mask structure comprises:
   first segments arranged in a direction surrounding a central axis and separated from one another; and
   second segments disposed above the first segments, wherein each of the second segments overlaps two of the first segments adjacent to each other in a vertical direction parallel to an extending direction of the central axis; and
   horizontally adjusting positions of the first segments and the second segments respectively between different deposition processes,
   wherein a distance between the central axis and an inner edge of each of the first segments in a radial direction outwards from the central axis is equal to a distance between the central axis and an inner edge of each of the second segments in the radial direction outwards from the central axis, and a distance between the central axis and an outer edge of each of the second segments in the radial direction outwards from the central axis is greater than a distance between the central axis and an outer edge of each of the first segments in the radial direction outwards from the central axis.

2. The operation method of the deposition device according to claim 1, wherein in each deposition process, the distance between the inner edge of each of the first segments and the central axis in the radial direction outwards from the central axis is equal to the distance between the inner edge of each of the second segments and the central axis in the radial direction outwards from the central axis.

3. The operation method of the deposition device according to claim 1, wherein the step of horizontally adjusting the positions of the first segments and the second segments respectively between the different deposition processes comprises:
   moving the first segments and the second segments towards the central axis or away from the central axis respectively.

4. The operation method of the deposition device according to claim 1, wherein the first segments are movable in a horizontal direction orthogonal to the extending direction of the central axis and in the vertical direction, and the second segments are movable in the horizontal direction and in the vertical direction.

5. The operation method of the deposition device according to claim 1, wherein each of the second segments further overlaps a gap between two of the first segments adjacent to each other in the vertical direction.

6. The operation method of the deposition device according to claim 1, wherein each of the second segments is separated from the first segments.

7. The operation method of the deposition device according to claim 1, wherein a projection area of each of the second segments in the vertical direction is smaller than a projection area of each of the first segments in the vertical direction.

8. The operation method of the deposition device according to claim 1, wherein the direction surrounding the central axis is a circular direction.

9. The operation method of the deposition device according to claim 1, wherein a length of each of the first segments in the radial direction outwards from the central axis is less than a length of each of the second segments in the radial direction outwards from the central axis.

10. The operation method of the deposition device according to claim 1, wherein an inner sidewall of each of the first segments and an inner sidewall of each of the second segments are oblique and a slope of the inner sidewall of each of the first segments is different from a slope of the inner sidewall of each of the second segments.

11. The operation method of the deposition device according to claim 10, wherein an included angle between the inner sidewall and a bottom surface of each of the second segments is smaller than an included angle between the inner sidewall and a bottom surface of each of the first segments.

12. The operation method of the deposition device according to claim 1, wherein an outer sidewall of each of the first segments and an outer sidewall of each of the second segments are oblique.

* * * * *